United States Patent [19]

Tanaka

[11] Patent Number: 5,708,603
[45] Date of Patent: Jan. 13, 1998

[54] SEMICONDUCTOR MEMORY DEVICE

[75] Inventor: Katsuji Tanaka, Tenri, Japan

[73] Assignee: Sharp Kabushiki Kaisha, Osaka, Japan

[21] Appl. No.: 678,873

[22] Filed: Jun. 18, 1996

[30] Foreign Application Priority Data

Jun. 19, 1995 [JP] Japan ................... 7-152024

[51] Int. Cl.$^6$ ................... G11C 11/34; G11C 7/00
[52] U.S. Cl. ................... 365/185.21; 365/185.22; 365/185.29; 365/185.33; 365/218
[58] Field of Search ................... 365/185.21, 185.22, 365/185.29, 185.33, 189.02, 189.07, 218

[56] References Cited

U.S. PATENT DOCUMENTS

| | | | |
|---|---|---|---|
| 5,262,990 | 11/1993 | Mills et al. | 365/189.02 |
| 5,504,875 | 4/1996 | Mills et al. | 365/189.02 |
| 5,557,572 | 9/1996 | Sawada et al. | 365/185.22 |

FOREIGN PATENT DOCUMENTS

| | | |
|---|---|---|
| 03125399 A | 5/1991 | Japan. |
| 04258022 A | 9/1992 | Japan. |

*Primary Examiner*—David C. Nelms
*Assistant Examiner*—Trong Quang Phan
*Attorney, Agent, or Firm*—Morrison & Foerster

[57] ABSTRACT

An object of the invention is to vary data width by changing over the readout mode, to change over the number of operating sense amplifiers in order to minimize the readout current, and to reduce the power consumption. A switch circuit operates only half of sense amplifiers by a first EN1 signal when the output data width is set at 8 bits by data width control signal BYTE. At this time, other sense amplifiers are not put in action, and hence the power consumption is saved. When the external output is 16 bits, all sense amplifiers are put in operation. Besides, in the case of internal readout operation such as verification by internal state signal RUN, all sense amplifiers are operated to perform an efficient high speed operation.

5 Claims, 6 Drawing Sheets

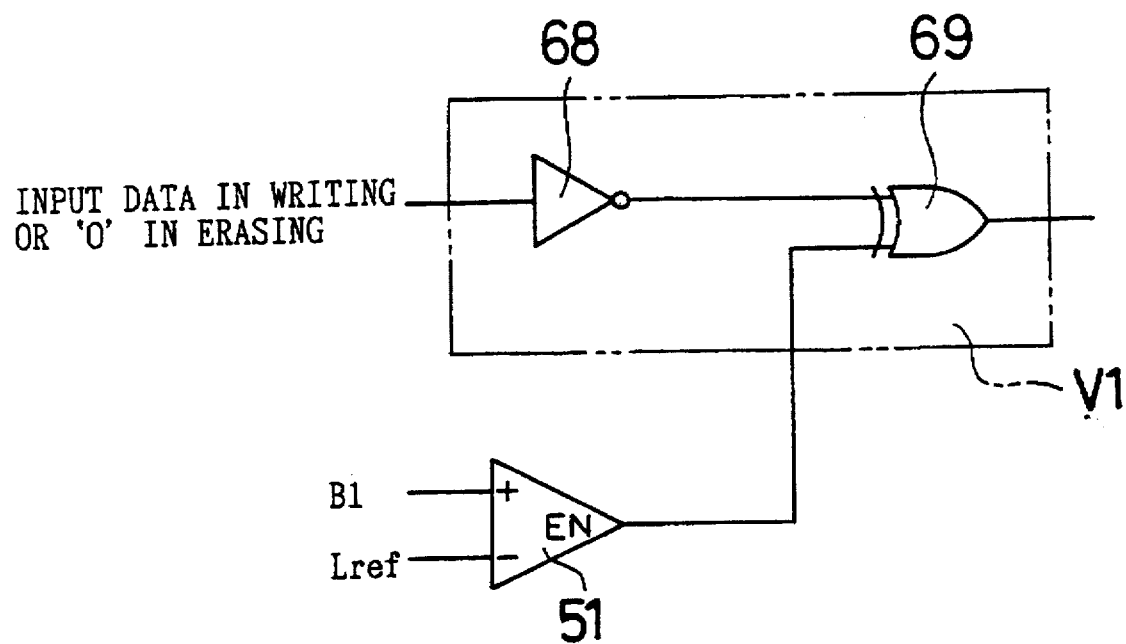

SEMICONDUCTOR MEMORY DEVICE

BACKGROUND OF THE INVENTION

1. Field of the Invention

The present invention relates to a sense circuit used in power consumption lowering technology, particularly in readout operation, of a semiconductor memory device.

2. Description of the Related Art

Of the semiconductor memory devices, hitherto, a nonvolatile memory has been used widely in storing of control programs and stationary data as a read-only memory (ROM) of a microcomputer system. Nonvolatile memories are available in multiple types, which are selected depending on the purpose of use. One of the representative nonvolatile memories is an EPROM (erasable programmable ROM). The EPROM allows a user to write data, but the data are erased by irradiation with ultraviolet rays. Since all memory array contents are erased in batch, every time the data are rewritten, the EPROM must be removed from the wiring board and programmed. Such EPROM is small in memory cell area, and is suited to large capacity use. It is, however, expensive because if requires an ultraviolet ray transmission window for ultraviolet erasure, and the data must be written using a writing device called programmer or writer, and it must be dismounted from the board of the system when writing, and it takes time and labor.

On the other hand, an electrically erasable and programmable ROM (EEPROM) can be electrically erased in the working system, but the memory cell area is about 1.5 to 2 times as large as the EPROM, and it is expensive and difficult to increase the capacity. Recently, therefore, as a semiconductor memory device intermediate between the EPROM and EEPROM, a so-called flash memory or flash EEPROM is developed. This flash memory is a nonvolatile semiconductor memory device having a function of electrically erasing the entire chip or the memory cell in a specific region called sector or block at one time, and the memory cell area is similar to that of the EPROM.

FIG. 6 shows a structure of a typical flash memory. At intersections of bit lines B1, B2, . . . and word lines W1, W2, . . . , memory elements 1, 2, 3, 4 . . . are disposed, and a memory matrix is composed. Each one of memory elements 1 to 4 has a structure of floating gate type field effect transistor, and a memory element of one bit can be composed by one transistor, and it is excellent in advancement of integration. The memory device 1 to 4 possess a control gate electrode 5 connected to the word lines W1, W2, . . . , a floating gate electrode 6 for storing data, a source electrode 7 connected commonly, and a drain electrode 8 connected to the bit lines B1, B2, . . . .

To write data into the memory elements 1 to 4, voltages of 12 V, 7 V and 0 V are applied to the control gate electrode 5, the drain electrode 8, and the source electrode 7, respectively, and hot electrons generated near the drain junction are injected into the floating gate electrode 6. By writing, the threshold voltage of the memory elements 1 to 4 as seen from the control gate electrode 5 becomes higher. On the other hand, to erase the data from the memory elements 1 to 4, the control gate electrode 5 is grounded, a positive high voltage of about 12 V is applied to the source electrode 7, a high electric field is generated between the floating gate electrode 6 and source electrode 7, and the electrons accumulated in the floating gate electrode 6 are extracted to the source electrode 7 side by making use of the tunnel phenomenon passing through a thin gate oxide film. By erasing, the threshold voltage of the memory elements 1 to 4 as seen from the control gate electrode 5 is lowered. Since the memory elements do not possess selective transistors, excessive erasure rendering the threshold voltage negative will be a fatal defect. By excessive erasure, even in the non-selected state in which the control gate voltage is 0 V, a drain current flows, which cannot be distinguished from the selected state.

To read out, a voltage of 0 V is applied to the source electrode 7, a low voltage of about 1 V is applied to the drain electrode 8, and a supply voltage of about 5 V is applied to the control gate electrode 5. Readout is conducted by taking advantage of that the magnitude of a current flowing in the channel between the drain electrode 8 and source electrode 7 corresponds to the stored data of 1 and 0. Herein, the drain voltage is a low voltage in order to avoid soft write which is a parasitic weak writing action.

In such memory elements 1 to 4, since the writing is done at the drain side and erasing at the source side, it is preferred to optimize the junction profile individually so as to be suited to each action. For example, as shown in FIG. 7, the source electrode 7 side and drain electrode 8 side are asymmetrical, and in the drain junction, in order to enhance the writing efficiency, a field crowding profile is used in drain junction and a field relaxation profile capable of applying a high voltage, in source junction.

In a first method of erasing wherein a high voltage is applied to the source electrode 7 when erasing, since the breakdown voltage of the source junction must be heightened, finer design is difficult at the source electrode 7 side, and hot holes may be generated near the source electrode and some of them may be trapped to lower the reliability of the memory cell. In a second method of erasing, a negative voltage of about −10 V is applied to the control gate electrode 5 and a supply voltage of about 5 V to the source electrode 7, and it is designed to erase by the tunnel current. An advantage of the second method is that a high junction breakdown voltage at the source electrode 7 side is not required because the voltage applied to the source electrode 7 when erasing is low, so that the gate length of the memory cell can be shortened.

In erasing methods of applying a high electric field to the source electrode 7 such as the first and second methods, an inter-band tunnel current flows, and its current value reaches as high as several milliamperes in the entire chip, which makes it difficult to use a boosting circuit. Therefore, conventionally, a high voltage Vpp for erasure is supplied from outside of the chip. In the second negative gate erasing method, it is possible to feed a supply voltage Vcc of 5 V or 3 V to the source electrode 7, and a single power source design is relatively easy. In a method of using hot electrons in writing, about 1 mA flows per cell when writing, and hence the same as the conventional EEPROM, there is a flash memory decreasing the flowing current per cell when writing by using the FM tunnel current.

In the trend of the finer design of semiconductor process and popularity of battery-driven portable appliances, lowering of operating power source voltage is desired. Accordingly, it leads to activation of demand and development of not only 5 V single action but also 3.3 V single action product. When reading out at a supply voltage Vcc of 3.3 V, in the present flash EEPROM, the supply voltage Vcc of 3.3 V or an internally boosted voltage of about 5 V for higher speed and wider operation margin is applied to the control gate electrode 5 connected to the word line.

In such nonvolatile semiconductor memory device, although the memory is nonvolatile, it has many operating states as compared with a random access memory (RAM) capable of writing and reading out in a short time. The operating states include writing, block erasing, all chip batch erasing, and reading out of state register. If attempted to correspond multiple operating states to the combinations of external control signal, it is insufficient with the control signals of the conventional EPROM or EEPROM, such as chip enable (/CE), write enable (/WE), and out enable (/OE), and it is necessary to add new control signals. Incidentally, the symbol "/" designates negative logic, which corresponds to the bar symbol in the drawing. As a result, the number of necessary external terminals increases and it impairs the convenience of use, and therefore a method of changing over the operating states by command system without increasing the control signal lines has been proposed, and is established now as the mainstream. In such nonvolatile semiconductor memory device, the command inputted by a user enters into a circuit for recognizing the command known as a command state machine (CSM), and a write state machine (WSM) executes an operation corresponding to the command, such as erasing and writing.

Usually, in the semiconductor memory device, depending on the purpose of use, the width of the output data is set, for example, as 8 bits or 16 bits. This data width may be set initially as a value intrinsic to the chip, or may be variable with Byte signal which is an output data width control signal, or the like. In the conventional semiconductor memory device, the sense amplifiers for issuing the bit line data to outside are provided as many as required depending on the data width. That is, if the data width is fixed at 8 bits, eight sense amplifiers are used, and when the data width is fixed at 16 bits, 16 sense amplifiers are disposed. When the data width is variable depending on the output data width control signal, for example, the data width is changed over between 8 bits and 16 bits, and 16 sense amplifiers are disposed. When the data width is 16 bits, 16 sense amplifiers are operated, and when the data width is 8 bits, all the 16 sense amplifiers are operated. In this case, a current flows also into unnecessary sense amplifiers. A technique for verifying automatically in an internal circuit when writing by using such sense amplifiers is disclosed, for example, in Japanese Unexamined Patent Publication JPA 3-125399 (1991). In this prior art, however, nothing is disclosed about control of the number of sense amplifiers to be operated.

FIG. 8 shows a constitution comprising, for example, 16 sense amplifiers 11, 12, ..., 25, 26. FIG. 8 shows the circuit structure of each one of the sense amplifiers 11, 12, ..., 25, 26. A sense circuit enable signal SEN is a signal which becomes a high potential when the sense amplifiers 11, 12, ..., 25, 26 are set in operating state. A transistor 31 shown in FIG. 9 is an N-channel MOS transistor, and it is turned on when the gate input enable signal EN is at high potential, and the sense amplifiers 11, 12, ..., 25, 26 are in operating state. When the enable signal EN is at low potential, the transistor 31 is on OFF state, and the sense amplifiers 11, 12, ..., 25, 26 do not operate. Since sense circuit enable signals SEN are entered in enable signals EN of all of 16 sense amplifiers 11, 12, ..., 25, 26, when the sense circuit enable signals SEN are at high potential, all N-channel MOS transistors 31 in the sense amplifiers 11, 12, ..., 25, 28 are simultaneously turned on, and all of the sense amplifiers 11 to 26 operate at the same time. The N-channel MOS transistors 232, 33 compose a differential pair, and P-channel MOS transistors 34, 35 compose a current mirror circuit.

In the conventional nonvolatile memory, in both cases where the data width is set from the beginning, and where the data width is variable depending on the output data control signal such as Byte signal, sense circuits of a similar structure are used. Therefore, even if the data width is selectable between 8 bits and 16 bits, unnecessary sense amplifiers are also operated. Consequently unnecessary current flows, and the power consumption increases. For example, Japanese Unexamined Patent Publication JPA 4-258022 (1992) discloses a constitution in which outputs of plural selected memory cells are sensed, logic processing is done on the basis of the sense results obtained therefrom, and output data corresponding to a specified data width is obtained. In this prior art, however, since the sense amplifiers corresponding to non-selected memory cells are also operated, unnecessary current flows, and the power consumption increases.

SUMMARY OF THE INVENTION

It is hence a primary object of the invention to present a semiconductor memory device capable of reducing the power consumption by minimizing the readout current in reading operation.

To achieve the object, the invention provides a semiconductor memory device possessing sense amplifiers as many as maximum bits, in which memory elements are disposed in a matrix form in a data width of a predetermined maximum number of bits, the semiconductor memory device comprising:

width setting means for setting a data width for external output within a range of the maximum number of bits, and control means for operating only sense amplifiers corresponding to the set data width, in response to outputs from the width setting means.

In the invention, the semiconductor memory device possesses a function of readout operation for internal output different from readout operation for external output, and the control means operates all sense amplifiers in readout operation for internal output.

In the invention, the memory element is structured as a floating gate type electric field transistor including:

a floating gate electrode for storing data, a control gate electrode for controlling data writing and reading out, a common source electrode, and a drain electrode for outputting data when reading out, and the sense amplifier compares an output voltage from the drain electrode of the selected memory element with a preset reference voltage, and outputs a logic value according to results of the comparison.

According to the invention, the data width for external output can be set within a range of maximum number of bits in the width setting means, and the control means operates only the sense amplifiers corresponding to the set data width. If possessing sense amplifiers corresponding to the maximum data width, the number of operating sense amplifiers correspond to the data width for external output, and therefore unnecessary sense amplifiers are not operated, resulting in reduction in power consumption.

Also according to the invention, the semiconductor memory device has a function of readout operation for internal output different from that for external output, and all sense amplifiers are operated by the control means at the time of readout operation for internal output, so that the readout function for external readout can be executed at high speed. Generally, such readout operation for internal output is the operation for confirming the content of written data at the time of writing, and hence such frequency is low, and in the usual external readout operation as a ROM, the power consumption can be sufficiently reduced.

Further according to the invention, the output data width of a flash EEPROM or the like using the floating gate type field effect transistor structure as a memory element is variable, and the power consumption can be reduced when using within the maximum data width.

Thus, according to the invention, in readout operation for output, corresponding to the change in number of bit lines by the change of output data width, only the same number of sense amplifiers can be operated. Hence, the current required for reading out is minimized, and the power consumption can be reduced.

According to the invention, in the case of readout operation for internal output such as verification, that is, the data once being read out is not issued outside, all sense amplifiers are operated, and efficient and high speed reading may be realized.

According to the invention, the output data width of a flash EEPROM using the floating gate type field effect transistor structure as a memory element is variable, and the power consumption can be reduced when operating at the output data width less than the maximum number of bits.

BRIEF DESCRIPTION OF THE DRAWINGS

Other and further objects, features, and advantages of the invention will be more explicit from the following detailed description taken with reference to the drawings wherein:

FIG. 4 is a block diagram for explaining a verification of an embodiment of the invention;

DETAILED DESCRIPTION OF THE PREFERRED EMBODIMENTS

Figure 1:
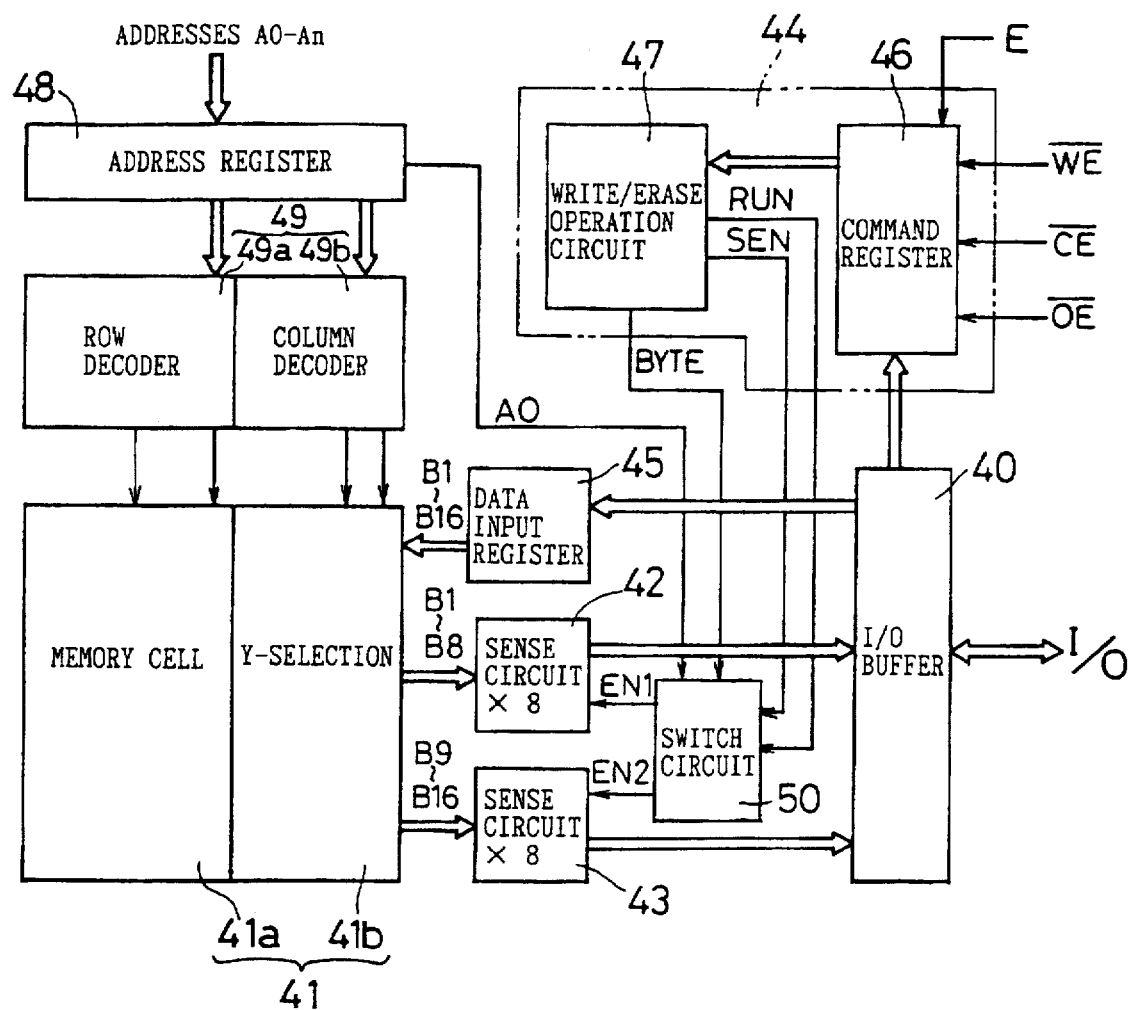
FIG. 1 is a block diagram showing a schematic electric constitution of an embodiment of the invention.

Now referring to the drawings, preferred embodiments of the invention are described below.

Figure 7:
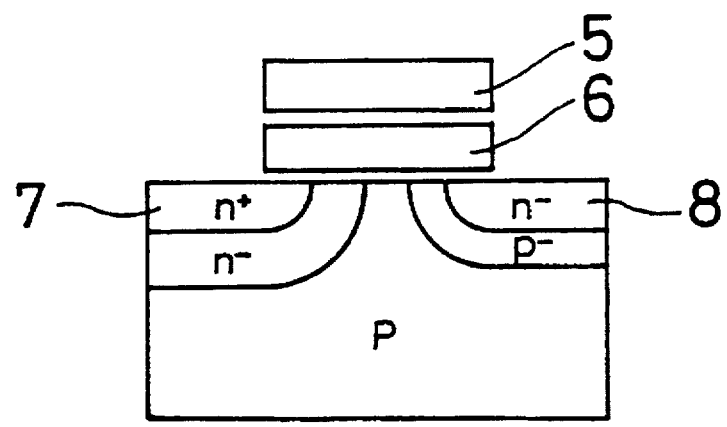
FIG. 7 is a simplified sectional view showing a constitution of a memory cell of nonvolatile memory.
Figure 8:
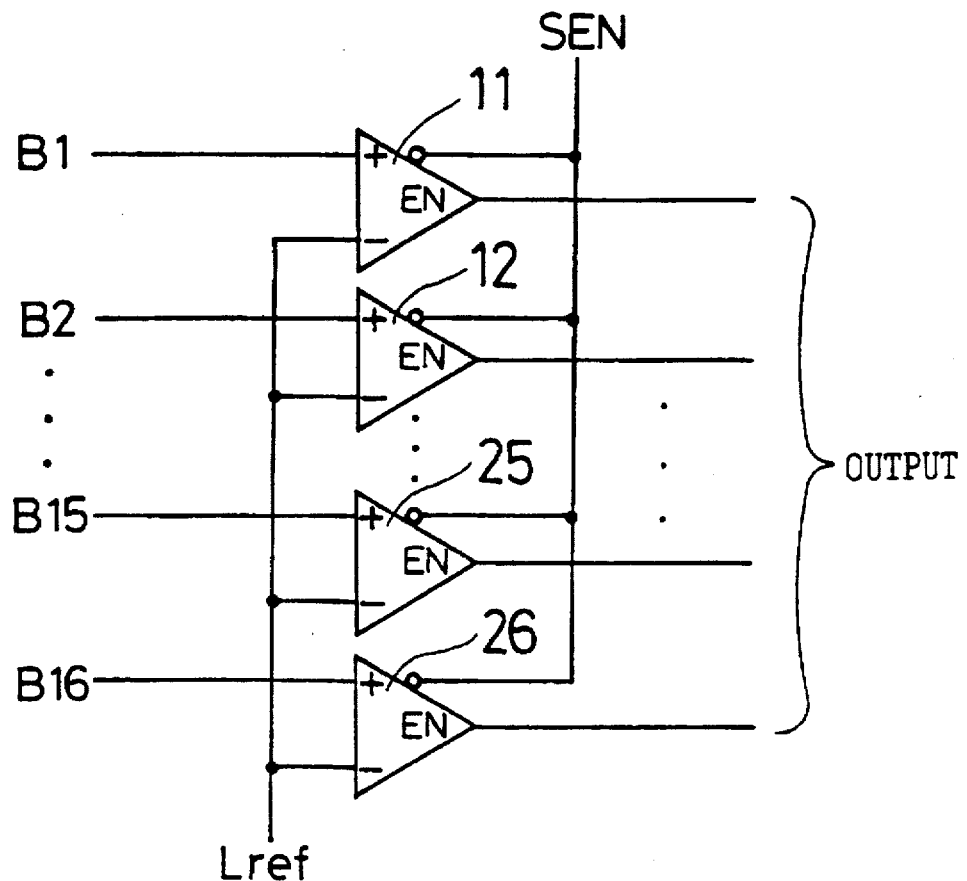
FIG. 8 is a block diagram showing a constitution of a conventional sense circuit.
Figure 9:
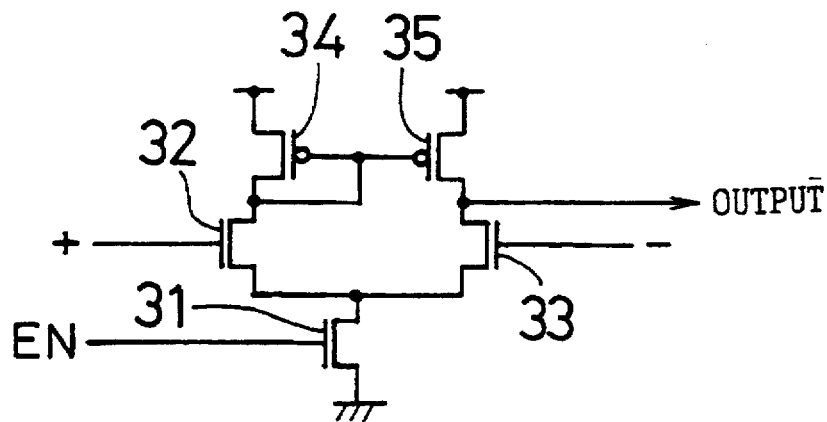
FIG. 9 is an electrical circuit diagram showing a constitution of a conventional sense amplifier.

FIG. 1 shows a schematic structure of a nonvolatile memory in an embodiment of the invention. The nonvolatile memory is connected to an external data bus through an input and output buffer 40. A memory array 41 comprises a memory cell array 41a and a Y selection circuit 41b. The memory cell array includes a number of memory cells, each having a floating gate type field effect transistor like the one shown in FIG. 7. The memory array is composed as a flash EEPROM. A memory array 41 has a data width of 16 bits, and data of bit lines are read by sense circuits 42, 43 of 8 bits each. The operation of the nonvolatile memory is controlled by a control circuit 44. In the case of verifying operation by internal readout of the memory array 41, data for comparison are stored temporarily in a data input register 45. In the control circuit 44, a command register 46 is connected to control signals chip enable (/CE), write enable (/WE), output enable (/OE) and batch erase E for storing a command given from outside, and a write and erase action circuit 47 for generating a control signal depending on the stored command are contained. In an address register 48, addresses A0 to An are given, and are decoded by a row decoder 49a and a line decoder 49b of a decoder 49, and the memory array 41 is selected. The lowest position address A0 is given to a switch circuit 50. Control signals RUN, SEN, BYTE generated in the write and erase operation circuit 47 are given to the switch circuit 50.

Figure 2:
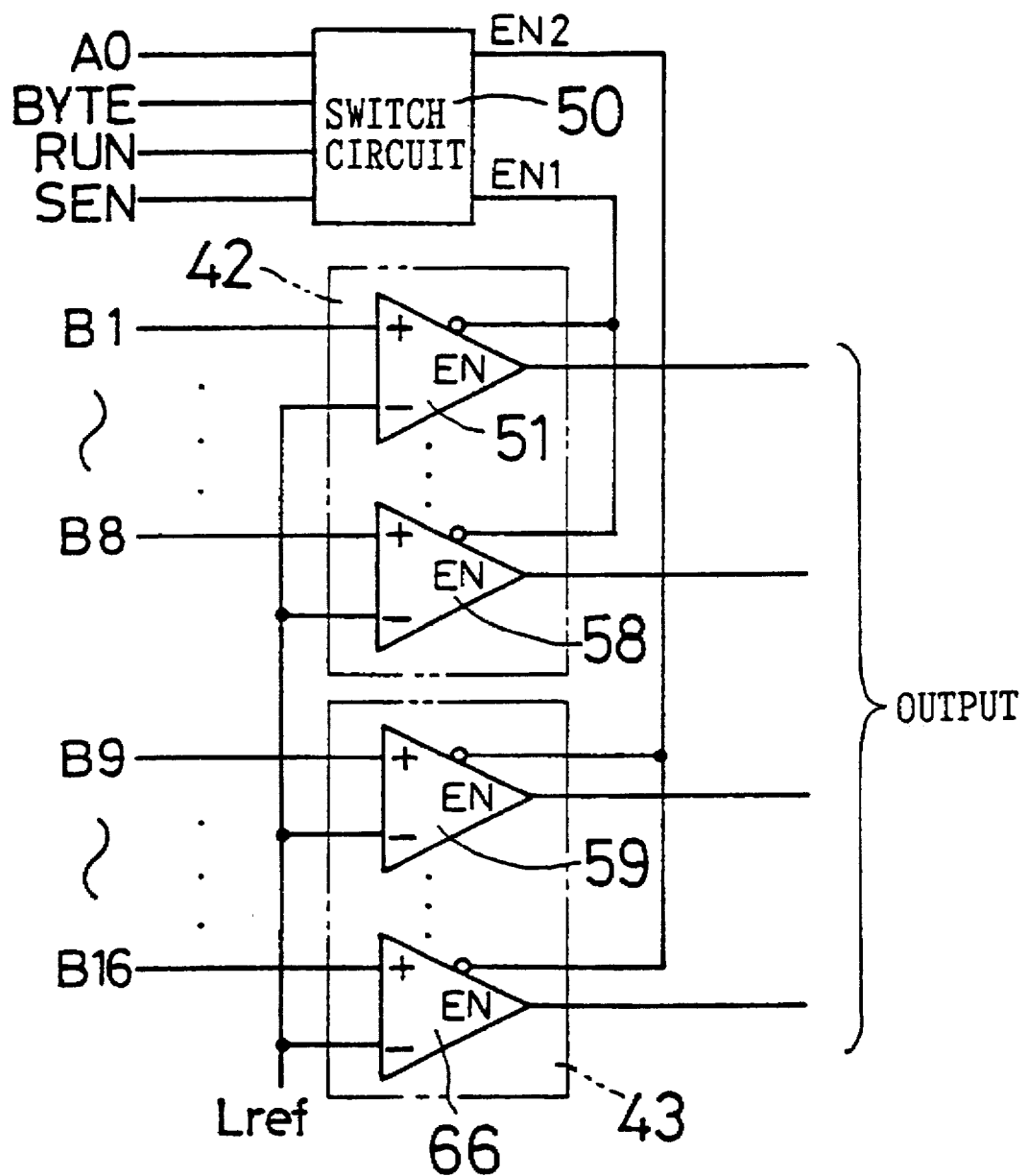
FIG. 2 is a block diagram showing a constitution relating to a switch circuit 50 and sense circuits 42, 43 of the embodiment in FIG. 1.

FIG. 2 shows a constitution of the switch circuit 50, and sense circuits 42, 43 of the embodiment of FIG. 1. In the switch circuit 50, control signals such as A0, BYTE, RUN, SEN and others are entered. From the switch circuit 50, a first enable signal EN1 is generated for the sense circuit 42, and a second enable signal EN2 is generated for the switch 43. The sense circuit 42 comprises sense amplifiers 51 to 58 for sensing bit lines B1 to B8. The sense amplifier 43 comprises sense amplifiers 59 to 66 for sensing bit lines B9 to B16. In each one of the sense amplifiers 51 to 66, Lref is commonly given as reference level.

Figure 3:
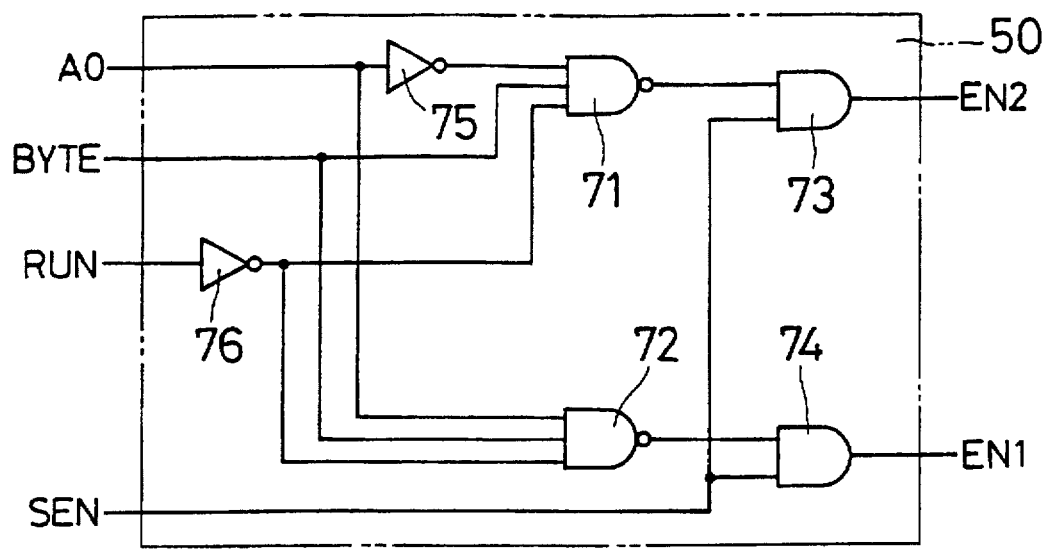
FIG. 3 is a block diagram showing a logical constitution of the switch circuit 50 in FIG. 2.

FIG. 3 shows an internal structure of the switch circuit 50 in FIG. 2. The switch circuit 50 comprises NAND gates 71, 72, AND gates 73, 74, and inverters 75, 76, and generates output signals EN1, EN2 as shown in Table 1, depending on control signals A0, BYTE, RUN, SEN. Herein, L indicates low level, H indicates high level, and X indicates that the output signals are independent of level.

TABLE 1

| Input signal read mode | AO | BYTE | RUN | SEN | EN1 | EN2 |
|---|---|---|---|---|---|---|
| Data width 8 bits | L | H | L | H | H | L |
| Data width 16 bits | H | L | L | H | H | H |
| Verify | X | X | H | H | H | H |

The operation of the embodiment is described below. When reading out at a data width of 8 bits, the data width control signal BYTE is at high level, the lowest address signal A0 is at low level, the internal state signal RUN is at low level, the sense amplifier control signal EN1 is at high level, and EN2 is at low level. As a result, eight sense amplifiers 51 to 58 are operated, and external readout operation is done. When reading out at the data width of 16 bits, the data width control signal BYTE is at low level, the lowest address signal A0 is at high level, the internal state signal RUN is at low level, the sense amplifier control signal EN1 is at high level, and EN2 is also at high level. As a result, all sense amplifiers 51 to 66 are put in operation. Thus, in the case of reading action at 8 bits, the power consumption is minimized, and unnecessary sense amplifiers 59 to 66 are not put in operation.

Incidentally, in the case of second readout operation such as verification in which the data once being readout are not issued outside, when the internal state signal RUN is at high level, it does not matter whether the data width control signal BYTE and lowest address signal A0 may be at high level or low level, that is, whether the data width is 8 bits or 16 bits, all sense amplifiers 51 to 66 are operated, and efficient and high speed second readout operation is executed.

FIG. 4 is a block diagram for explaining a verification of an embodiment of the invention. The above-mentioned verification, which is executed in the second readout operation, is also executed in writing input data into the memory cell 41a and erasing data stored in the memory cell 41a. By the verification it is possible to verify storing of data into the memory cell 41a and erasing of data stored in the memory cell 41a. A verification circuit for executing this verification is arranged in a nonvolatile memory (not shown in FIG. 1), and connected to the outputs of the sense amplifiers 51 to 66. A verification circuit V1 is composed of an inverter circuit 68 and an exclusive "OR" circuit 69. Herein only the verification circuit V1 connected to the sense amplifier 51 will be described, however, verification circuits connected to the other sense amplifiers 52 to 66 are similarly structured.

In the case of verification of writing of input data into the memory cell 41a, data of 1-bit out of the input data in writing, for example, "1", are supplied to the inverter circuit 68 of the verification circuit V1, where the supplied data are inverted, and then supplied to one input terminal of the exclusive "OR" circuit 69. At this time an output from the sense amplifier 51 is supplied to the other input terminal of the exclusive "OR" circuit. When the output of the exclusive "OR" circuit 69 to both input terminals of which data were supplied is "0", it is verified that input data have been exactly written into the memory cell 41a. To the contrary, when the output of the exclusive "OR" circuit 69 is "1", it is verified that input data are not exactly written, for example, writing of some data was omitted.

The verification of data writing is executed each time input data are written into the memory cell 41a. In the verification the data written into the memory cell 41a are verified. The same number of sense amplifiers out of the sense amplifiers 51 to 66 as in writing are operated. Thereby the data in the memory cell 41a are internally read out and verification is executed. For example, in the case where data of the data width of 8-bits are written, the sense amplifiers 51 to 59 are operated, data of 8-bits in the memory cell 41a are read out, and verification is executed. Since the verification does not require so much time, all the sense amplifiers 51 to 66 may be operated.

Erasing of the data stored in the memory cell 41a is executed in each sector or block of the memory cell 41a. By setting "0" or "1" equally in each sector or block of the memory cell 41a, erasing of data is executed. In the embodiment, "0" is set. In the case of verification of erasing of data, when the stored data have been erased, the set data "0" is supplied to the inverter circuit 68 of the verification circuit V1, where the supplied data are inverted, and then supplied to one input terminal of the exclusive "OR" circuit 69. At this time, an output from the sense amplifier 51 is supplied to the other input terminal of the exclusive "OR" circuit. When the output of the exclusive "OR" circuit 69 to both input terminals of which data were supplied is "0", it is verified that the stored data have been exactly erased. To the contrary, when the output of the exclusive "OR" circuit 69 is "1", it is verified that the stored data are not exactly erased.

The data stored in the memory cell 41a are batch-erased in units of sector or block, and verification is executed simultaneously with the batch-erasing of the data. When batch-erasing of data in units of sector or block is instructed, all the sense amplifiers 51 to 66 are operated. Thereby the data stored in the memory cell 41a are internally read out, and verification is executed. For example, in the case where the nonvolatile memory is used in the data width of 8-bits, the sense amplifiers 51 to 66 are operated, two sets of data of the data width of 8-bits are verified at one time. Accordingly, since in the second readout operation, particularly in verification of erasing of data, all the sense amplifiers 51 to 68 are operated regardless of data width, an efficient and high-speed operation is realized as the second operation.

Figure 5:
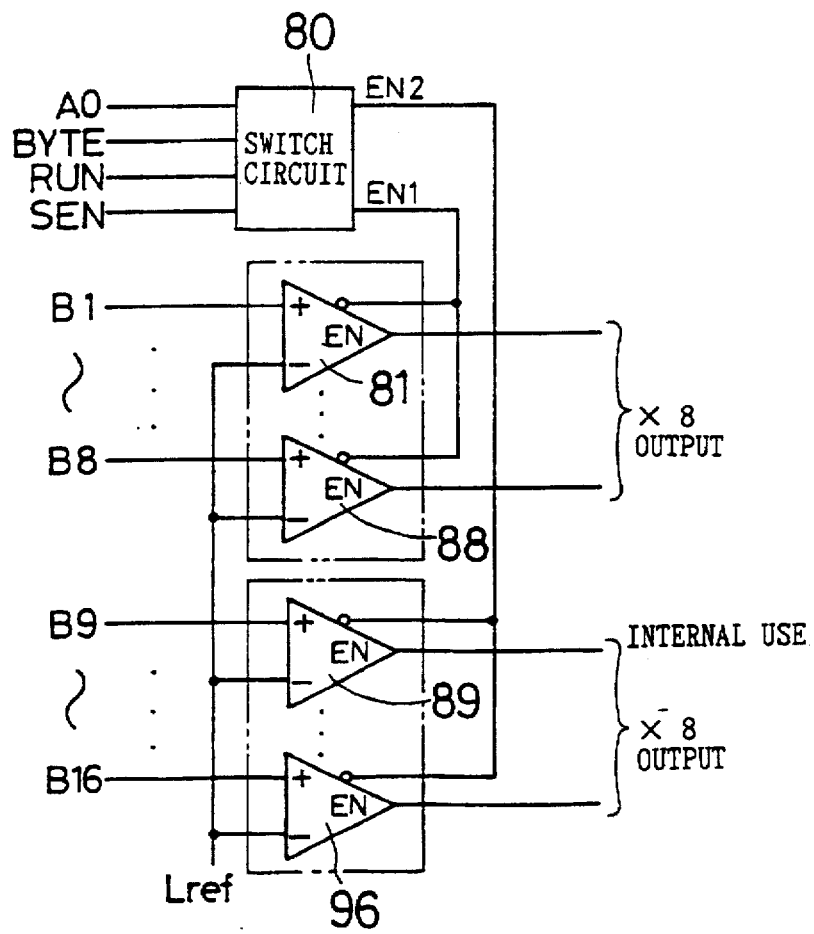
FIG. 5 is a block diagram showing a constitution of a switch circuit 80 and sense amplifiers 81 to 96 in another embodiment of the invention.
Figure 6:
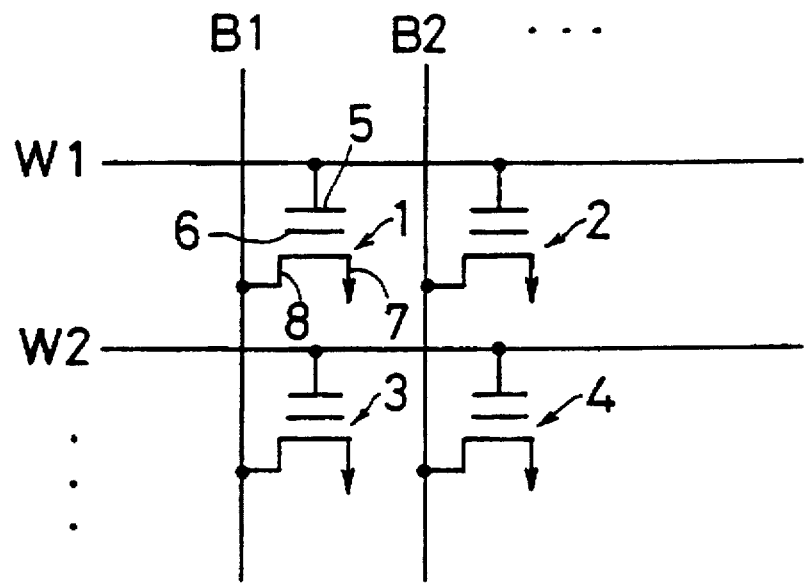
FIG. 6 is an electric circuit diagram showing part of a constitution of a memory matrix of nonvolatile memory.

FIG. 5 shows a constitution of a sense circuit of another embodiment of the invention, in which 16 sense amplifiers 81 to 96 are disposed and the data width are fixed at 8 bits. The internal structures of the switch circuit 80 and sense amplifiers 96 are similar to those of the switch circuit 50 and sense amplifiers 51 to 66 in the preceding embodiment. The verification circuit as shown in FIG. 4 is also connected to the sense amplifiers 81 to 96. In this embodiment, in the case of external readout operation, only eight sense amplifiers 81 to 88 are operated, and unnecessary sense amplifies 89 to 96 are not operated, thereby minimizing the power consumption. In the case of the second readout operation such as verification, all of 16 sense amplifiers 81 to 96 are operated, and an efficient and high speed second readout operation is realized. Thus, by disposing the sense amplifiers more than the fixed data width, when reading out, the number of sense amplifiers corresponding to the fixed data width are operated, and in the case of second readout such as verification, all sense amplifiers are put in operation, so that both saving of power consumption and high speed operation when required may be expected.

In the foregoing description, the invention is applied to the nonvolatile memory such as a flash EEPROM as a semiconductor memory device, but the power consumption can be also saved by applying to a volatile static RAM or a dynamic RAM. Even if the output data width is limited to the maximum output data width of 16 bits or less (e.g., 8 bits) depending on the application, for example, when verifying, since data are not issued outside from the semiconductor memory device, the sense amplifiers corresponding to the maximum output data width are operated, and efficient and high speed second readout operation can be realized.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A semiconductor memory device having a number of sense amplifiers and a number of memory elements arranged in an array having a width equal to a predetermined maximum number of bits, the number of sense amplifiers equal to the predetermined maximum number, said sense amplifiers coupled to said memory elements, said memory device comprising:

width setting means for setting data width for external output to be within a range of the maximum number of bits; and control means coupled to said sense amplifiers and said width setting means, said control means for operating only sense amplifiers corresponding to the set data width, in response to an output from the width setting means;

wherein the memory device has a function of readout operation for internal output different from readout operation for external output;

wherein the control means operates all sense amplifiers in readout operation for internal output;

wherein the readout operation for internal output is a verification operation of verifying contents stored in the memory element.

2. The semiconductor memory device of claim 1, wherein the verification operation is executed when the contents stored in the memory element are erased.

3. The semiconductor memory device of claim 1, wherein the memory element is structured as a floating gate type electric field transistor including:

a floating gate electrode for storing data, a control gate electrode for controlling writing and reading out of data, a common source electrode, and a drain electrode for outputting data when reading out, and the sense amplifier compares an output voltage from the drain electrode of the selected memory element with a preset reference voltage, and outputs a logic value according to results of the comparison.

4. The semiconductor memory device of claim 3, having a storage region composed of a predetermined number of memory elements, wherein in the case of erasing data, the control means applies a voltage to the source electrodes of all the memory elements composing the storage region and grounds the control gate electrodes of all the memory elements composing the storage region to batch-erase data stored in the floating gate electrodes of all the memory elements composing the storage region.

5. The semiconductor memory device of claim 3, being a flash memory capable of erasing data stored in the predetermined number of memory elements at one time.

* * * * *